United States Patent [19]

Lumley

[11] 4,370,568
[45] Jan. 25, 1983

[54] SUPERCONDUCTING, FAST RISE-TIME VOLTAGE SOURCE

[75] Inventor: Robert M. Lumley, Lawrence Township, Mercer County, N.J.

[73] Assignee: Western Electric Company, Inc., New York, N.Y.

[21] Appl. No.: 102,076

[22] Filed: Dec. 10, 1979

[51] Int. Cl.³ .............................................. H03K 3/38
[52] U.S. Cl. .................................. 307/260; 307/245; 307/277; 307/306; 357/4; 357/83
[58] Field of Search ............... 307/306, 277, 212, 245, 307/263, 261, 260; 357/4, 83

[56] References Cited

U.S. PATENT DOCUMENTS

| | | | |
|---|---|---|---|
| 3,271,592 | 9/1966 | Bremer et al. | 307/245 X |
| 3,360,678 | 12/1967 | Kerns | 307/106 |
| 3,956,727 | 5/1976 | Wolf | 307/306 X |
| 3,983,419 | 9/1976 | Fang | 307/306 X |
| 4,140,917 | 2/1979 | Weiner | 307/106 |
| 4,168,441 | 9/1979 | McDonald et al. | 307/306 X |

OTHER PUBLICATIONS

C. J. Kraus, "Superconductive Memory Cell", IBM Technical Disclosure Bulletin, vol. 2, No. 4, Dec. 1959, p. 131.

Primary Examiner—John Zazworsky
Attorney, Agent, or Firm—B. W. Sheffield; M. M. de Picciotto

[57] ABSTRACT

A pulse generator comprises a toroid (11) of a superconducting material such as Niobium on a glass or ceramic substrate (12). A cryogenic source such as liquid helium cools the toroid to within a few degrees of absolute zero and a perpetually circulatory current is set up in the toroid. A laser beam is fired at the toroid to cause localized heating and the resultant current drop due to the material resistance causes an output pulse to be induced in an adjacent current winding (14).

6 Claims, 4 Drawing Figures

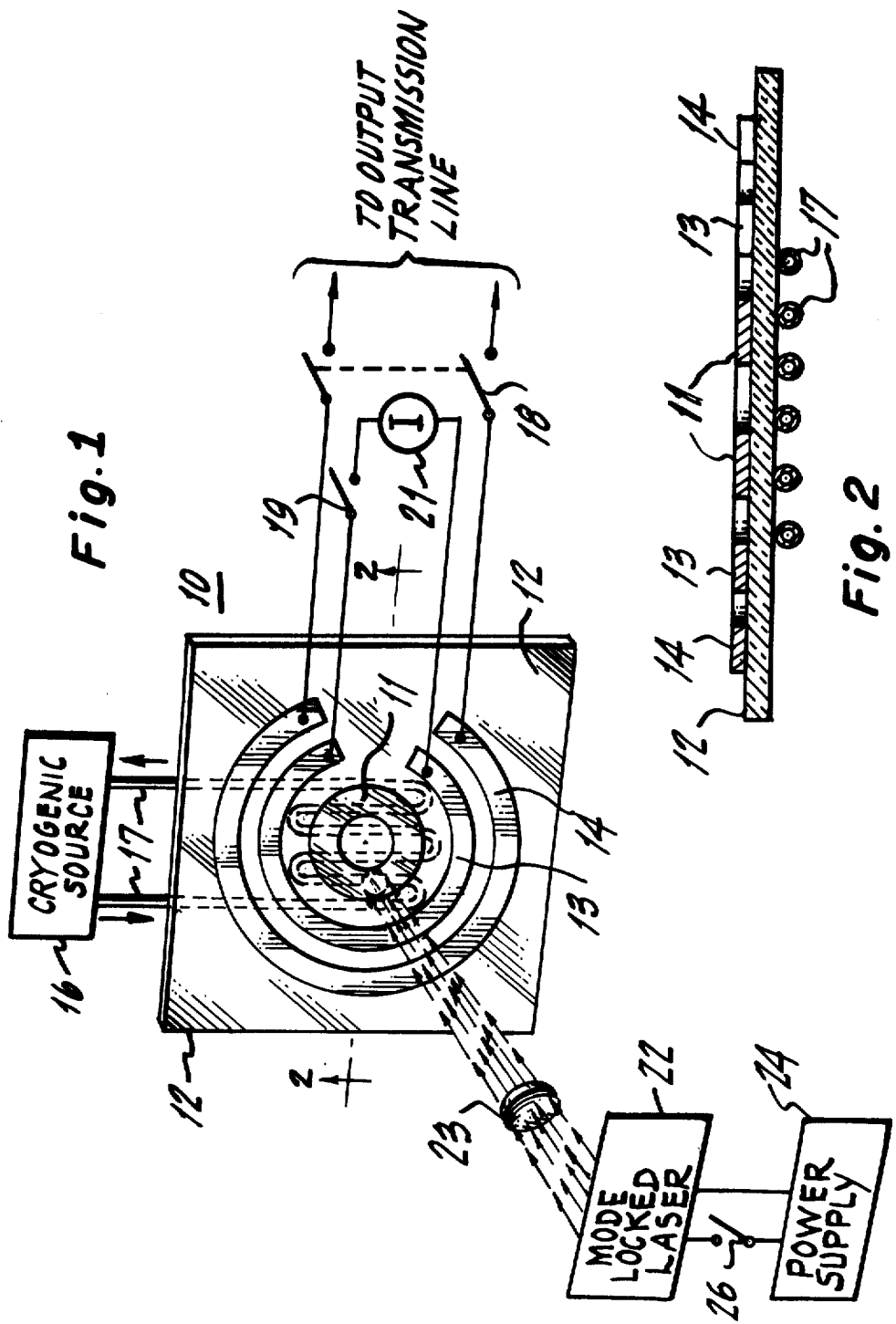

SUPERCONDUCTING, FAST RISE-TIME VOLTAGE SOURCE

TECHNICAL FIELD

Broadly speaking, this invention relates to the generation of electrical impulses. More particularly, in a preferred embodiment, this invention relates to a pulse generator that is capable of generating output pulses having extremely short rise-times.

BACKGROUND OF THE INVENTION

The design of semiconductor devices has progressed to the point where switching times on the order of 100 picoseconds, or less, are routinely achieved (1 picosecond = $10^{-12}$ sec.). In accordance with well-known principles, in order to test such devices, pulses having rise-times on the order of 10 picoseconds, or less, are required.

Unfortunately, it has not been possible to generate such short rise-time pulses with prior art pulse generators. U.S. Pat. No. 3,360,678, which issued on Dec. 26, 1967, to Q. A. Kerns, discloses a fast pulse generator which uses an electron beam to cause an arc breakdown across the gap region of the center conductor of a coaxial cable. However, the fastest pulse that Kerns can develop has a rise-time in the order of 1 nanosecond (1,000 picoseconds) which is useless for testing semiconductor devices that can switch in 100 picoseconds. U.S. Pat. No. 4,140,917, which issued on Feb. 20, 1979 to Maurice Weiner discloses a fast rise-time spiral pulse stripline generator but, again, only pulses in the order of several nanoseconds are achieved by this apparatus.

SUMMARY OF THE INVENTION

As a solution to the above and other problems, the instant invention comprises a pulse generator having a superconducting, thin-film toroid which is cryogenically cooled to within a few degrees of absolute zero (−273° C.). A current pulse in an adjacent winding induces a large, perpetually circulating current in the superconducting toroid. Then, a high-power burst of optical radiation, e.g., from a mode-locked laser, is focused upon the toroid to cause localized heating. This, in turn, raises a portion of the superconducting toroid above its critical temperature. The effect of this is as if a very large resistor were suddenly inserted in series with the current loop. The resulting sudden, large drop in current is sensed by an output coil which, thus, generates the desired output pulse.

The invention and its mode of operation will be more fully understood from the following detailed description, when taken with the appended drawings in which:

BRIEF DESCRIPTION OF THE DRAWINGS

FIG. 1 is a partially plan, partially block schematic drawing of an illustrative pulse generator according to the invention;

FIG. 2 is a side view of the superconducting toroid shown in FIG. 1; and

DETAILED DESCRIPTION

Figure 4:
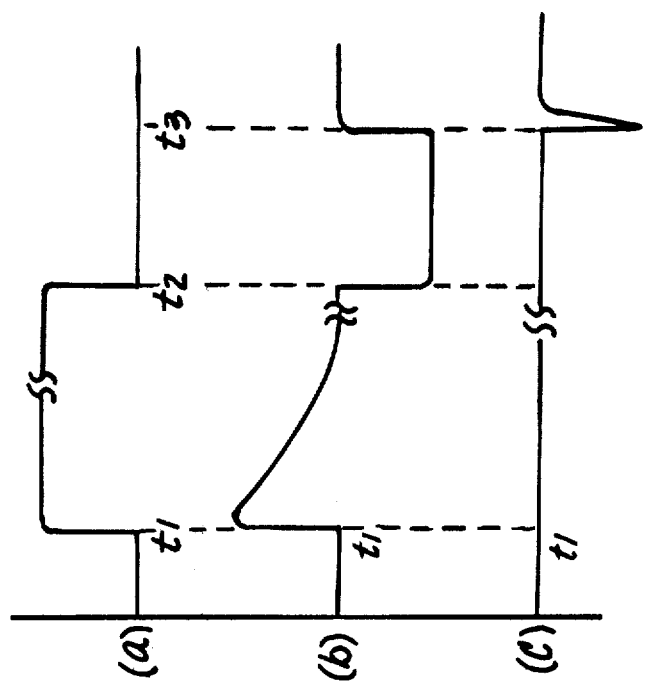
FIGS. 3 and 4 are graphs showing the various waveforms present in the apparatus shown in FIG. 1.

FIG. 1 depicts a first illustrative embodiment of the invention. As shown, pulse generator 10 comprises a superconducting, thin-film toroid 11 which is deposited on some suitable substrate 12. A thin-film current coil 13 and a thin-film output coil 14 are also deposited on substrate 12, coaxially with the toroid 11. Advantageously, the toroid and coils 13 and 14 are formed on the substrate 12 at the same time, using any of several known deposition processes, e.g., by sputtering a thin film over the entire surface of substrate 12 and then removing the unwanted portions by masking and etching.

The material which comprises the superconducting toroid must, of course, exhibit superconducting properties at the temperature of interest and Niobium (Nb), Niobium-Tin ($Nb_3Sn$), and Vanadium-Silicon ($V_nSi$) thin films are suitable for this purpose. The material from which conductors 13 and 14 are fabricated is not as critical provided, of course, that it conducts electricity. However, if all three conductors are laid down at the same time then, of course, they will each comprise the same material. The substrate 12 may comprise glass or some suitable ceramic, however, since the substrate will also be cooled to a very low temperature, care must be taken to avoid a material that might shatter due to the stresses induced by the cooling.

As previously mentioned, the toroid is cooled to within a few degrees of absolute zero by means of a cryogenic fluid, such as liquid helium, which is fed from some suitable source 16, via a serpentine arrangement of cooling pipes 17 on the back surface of the substrate. Other arrangements for cooling the toroid are possible, for example, immersing the entire substrate in liquid helium; however, the arrangement shown in FIG. 1 is preferred.

The ends of output coil 14 are connected, via a switch 18, to the output transmission line. In like fashion, the ends of the induction coil 13 are connected, via some suitable switch 19, to a current source 21, e.g., a battery. A source of high-energy, optical radiation, for example, a mode-locked laser 22, is positioned so that the light energy which is output therefrom may be focused by a lens 23 to fall upon a portion of toroid 11. Laser 22 is connected to some suitable power supply 24, via a switch 26.

In one mode of operation, the cryogenic source 16 is activated to cool the toroid 11 to within a few degrees of absolute zero. When this temperature has been attained, switch 19 is closed and a current pulse will traverse current winding 13. The magnetic field established by this current will induce a current in toroid 11 such that the net magnetic flux through toroid 11 remains approximately zero. This allows a very large current to flow in the current winding 13 and toroid 11. Switch 18 is then closed to connect the output coil to the transmission line.

When it is desired to create the output pulse, switch 26 is closed to energize the mode-locked laser. The beam of radiant energy which emerges from the laser is focused by lens 23 into an intense spot of radiation on the surface of toroid 11. This intense optical radiation causes localized heating and raises the temperature of the impinged portion of the toroid above its critical temperature. This causes an abrupt increase in the electrical resistance of that portion of the toroid. The effect of this resistance change is as if a very large resistor were suddenly inserted in series with the current loop. The resulting sudden, large drop in current is sensed by output coil 14 which, thus, generates the desired output pulse. The time taken for the superconducting material to switch to a non-superconducting state is actually less than 1 picosecond; however, even the minimal self and mutual inductances of the toroid and coils are sufficient to slow down the current change to about 10 picoseconds. In the second mode of operation, toroid 11 is allowed to warm to a non-superconducting temperature. When this temperature has been attained, switch 19 is closed and a current pulse will traverse current winding 13. The magnetic field established by this current will induce a current in toroid 11. The energy associated with the induced current of toroid 11 will be dissipated by the resistance of the toroid, thus causing the induced current to drop to zero and the enclosed magnetic flux to rise to the equilibrium value. Toroid 11 is then cooled to its superconducting temperature and, when the superconducting temperature is attained, switch 19 is opened. The collapse of the magnetic flux enclosed by toroid 11 induces a large current in toroid 11 which will circulate indefinitely. Switch 18 is then closed to connect the output coil to the transmission line. Once again, when it is desired to create the output pulse, switch 26 is closed to energize the mode-locked laser. The beam of radiant energy which emerges from the laser is focused by lens 23 into an intense spot of radiation on the surface of toroid 11. This intense optical radiation causes localized heating and raises the temperature of the impinged portion of the toroid above its critical temperature. This causes an abrupt increase in the electrical resistance of that portion of the toroid. The resulting sudden, large drop in current is sensed by output coil 14 which, thus, generates the desired output pulse.

Figure 3:
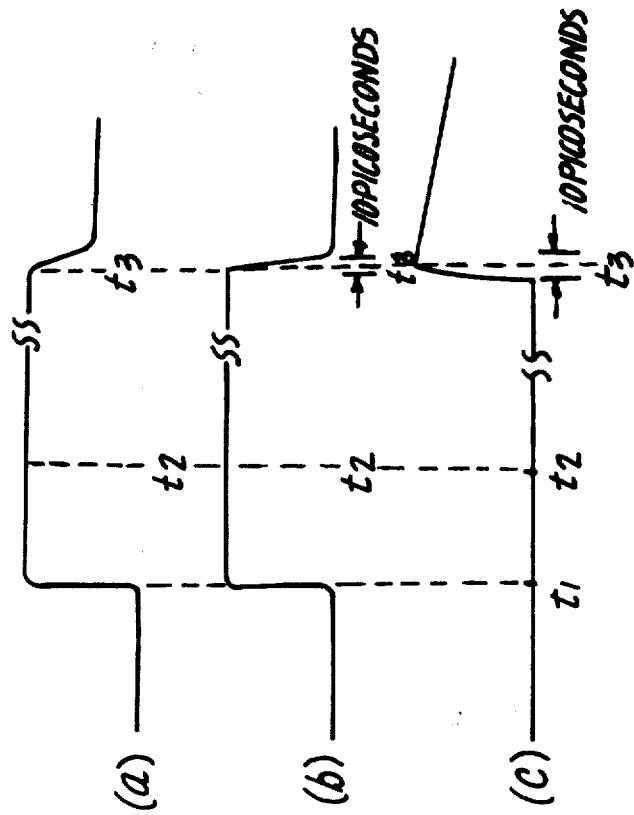

FIG. 3 depicts the waveforms present in the circuit shown in FIG. 1 when the first mode of operation is used. Waveform A represents the current present in current coil 13 from a point of time just before switch 19 is closed. Waveform B represents the current in toroid 11 which, as noted, continues at a steady level until laser 22 is activated, and waveform C represents the pulse generated in output coil 14.

FIG. 4 depicts the waveforms present in the circuit shown in FIG. 1 when the second mode of operation is used. Waveform A represents the current present in current coil from a point of time just before switch 19 is closed. Waveform B represents the current present in toroid 11 which, as noted, continues at a steady level after switch 19 is opened and until laser 22 is activated. Waveform C represents the pulse generated in output coil 14.

One skilled in the art may make various changes and substitutions to the layout of parts shown without departing from the spirit and scope of the invention.

What is claimed is:

1. Apparatus for generating an electrical pulse having an extremely short rise-time comprising:
   an electrically conducting toroid;
   means for cooling said toroid to approximately absolute zero, whereupon said toroid becomes superconducting;
   means, magnetically coupled to said toroid, for inducing a perpetually circulating current in said toroid;
   means for heating a portion of said toroid to a temperature above the critical temperature thereof; and
   means, magnetically coupled to said toroid, for sensing the abrupt drop in the circulating current that occurs therein when said critical temperature is exceeded, wherein said toroid, said current inducing means, and said current sensing means comprise coplanar, coaxial, thin metallic films deposited on a substrate.

2. The apparatus according to claim 1 wherein said cooling means comprise:
   a source of a cryogenic liquid; and
   means positioned on the back surface of said substrate for circulating said liquid proximate the toroid, thereby to cool the same.

3. The apparatus according to claim 1 wherein said current inducing means comprises:
   a current coil;
   a current source; and
   means for completing a circuit between said current source and said current coil.

4. Apparatus for generating an electrical pulse having an extremely short rise-time which comprises:
   an electrically non-conductive substrate;
   a thin film of superconducting material deposited on said substrate, said film being in the shape of a toroid;
   a current inducing coil comprising a thin, circular film of conductive material deposited on said substrate, coaxial with said toroid; and
   an output coil comprising a thin, circular film of conductive material deposited on said substrate, coaxial with said toroid.

5. Apparatus for generating an electrical pulse having an extremely short rise-time comprising:
   an electrically conducting toroid;
   means for cooling said toroid to approximately absolute zero, whereupon said toroid becomes superconducting;
   means, magnetically coupled to said toroid, for inducing a perpetually circulating current in said toroid;
   means for heating a portion of said toroid to a temperature above the critical temperature thereof; and
   means comprising a thin film coil magnetically coupled to said toroid, for sensing the abrupt drop in the circulating current that occurs therein when said critical temperature is exceeded.

6. Apparatus for generating an electrical pulse having an extremely short rise-time comprising:
   an electrically conducting toroid;
   means for cooling said toroid to approximately absolute zero, whereupon said toroid becomes superconducting;
   means, magnetically coupled to said toroid, for inducing a perpetually circulating current in said toroid;
   means for heating a portion of said toroid to a temperature above the critical temperature thereof, said heating means including a laser, means for focusing the optical output from said laser onto a portion of said toroid, and means for selectively energizing said laser; and
   means, magnetically coupled to said toroid, for sensing the abrupt drop in the circulating current that occurs therein when said critical temperature is exceeded.

* * * * *